United States Patent
Ogawa et al.

(10) Patent No.: US 7,656,677 B2
(45) Date of Patent: Feb. 2, 2010

(54) MULTILAYER ELECTRONIC COMPONENT AND STRUCTURE FOR MOUNTING MULTILAYER ELECTRONIC COMPONENT

(75) Inventors: Nobuaki Ogawa, Omihachiman (JP); Norio Sakai, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 97 days.

(21) Appl. No.: 10/554,671

(22) PCT Filed: Jan. 5, 2005

(86) PCT No.: PCT/JP2005/000027

§ 371 (c)(1),
(2), (4) Date: Oct. 27, 2005

(87) PCT Pub. No.: WO2005/071744

PCT Pub. Date: Aug. 4, 2005

(65) Prior Publication Data

US 2006/0281297 A1 Dec. 14, 2006

(30) Foreign Application Priority Data

Jan. 27, 2004 (JP) ............................. 2004-018144

(51) Int. Cl.
*H05K 7/00* (2006.01)
(52) U.S. Cl. ....................... 361/760; 174/260
(58) Field of Classification Search ................. 361/760; 257/700, 774, 687; 174/257–260
See application file for complete search history.

(56) References Cited

U.S. PATENT DOCUMENTS

| 6,153,448 | A  | * | 11/2000 | Takahashi et al. | ........... 438/114 |
| 6,538,210 | B2 | * | 3/2003  | Sugaya et al.    | ............... 174/258 |
| 6,815,810 | B2 | * | 11/2004 | Takehara et al.  | ............ 257/687 |
| 6,828,669 | B2 | * | 12/2004 | Iijima et al.    | ................. 257/700 |
| 6,838,765 | B2 | * | 1/2005  | Hyodo et al.     | ............... 257/704 |
| 6,866,255 | B2 | * | 3/2005  | Fork et al.      | ................. 267/37.1 |
| 2003/0071350 | A1 | * | 4/2003 | Takehara et al. | ............ 257/728 |
| 2003/0141105 | A1 | * | 7/2003 | Sugaya et al.    | ............... 174/256 |
| 2008/0258283 | A1 | * | 10/2008 | Shimoto et al.  | ............. 257/678 |

(Continued)

FOREIGN PATENT DOCUMENTS

JP          09-199635        7/1997

(Continued)

*Primary Examiner*—Dean A. Reichard
*Assistant Examiner*—Yuriy Semenenko
(74) *Attorney, Agent, or Firm*—Keating & Bennett, LLP

(57) ABSTRACT

A multilayer electronic component includes a multilayer substrate having a first main surface and a second main surface, a resin layer having a mounting surface and a contact surface bonded to the first main surface, a via conductor provided inside the resin layer, and an external terminal electrode disposed on the mounting surface so as to come in contact with the via conductor. The external terminal electrode has a first region on a main surface facing the mounting surface and a second region on a main surface facing away from the mounting surface. The first region is connected to the via conductor while the second region is provided with a bonding member. The second region is arranged such that, when the first region is projected through to the main surface facing away from the mounting surface, the second region is spaced from and does not overlap with a region in which the first region is projected.

20 Claims, 10 Drawing Sheets

U.S. PATENT DOCUMENTS

| | | | |
|---|---|---|---|
| 2009/0008790 A1* | 1/2009 | Lee et al. | 257/774 |
| 2009/0008792 A1* | 1/2009 | Ko et al. | 257/774 |

FOREIGN PATENT DOCUMENTS

| | | |
|---|---|---|
| JP | 10-313074 | 11/1998 |
| JP | 2001-244638 | 9/2001 |
| JP | 2003-124435 | 4/2003 |
| JP | 2003-309213 | 10/2003 |

* cited by examiner

MULTILAYER ELECTRONIC COMPONENT AND STRUCTURE FOR MOUNTING MULTILAYER ELECTRONIC COMPONENT

BACKGROUND OF THE INVENTION

1. Field of the Invention

The present invention relates to multilayer electronic components and structures for mounting the multilayer electronic components.

2. Description of the Related Art

In recent years, low temperature co-fired ceramic (LTCC) substrates have been in the mainstream of multilayer ceramic substrates. LTCC, which can be fired at low temperatures, namely not more than 1,000° C., allows the use of low-resistance metals such as silver and copper for wiring conductors.

LTCC is provided at reduced firing temperatures and often contains a considerable amount of glass. This material is therefore more brittle than pure ceramics. For example, pure alumina has a flexural strength of about 300 MPa while an LTCC material containing alumina and glass in a volume ratio of 50:50 has a flexural strength of about 200 MPa.

If, therefore, a drop test is performed on a printed circuit board mounting such a multilayer ceramic substrate, a tensile stress occurs at the junctions therebetween to readily cause cracks at the portions of the multilayer ceramic substrate to which the printed circuit board is bonded.

To compensate for such mechanical brittleness, multilayer ceramic substrates have been proposed which have a resin layer that functions as a shock absorber. FIG. 20 is a schematic sectional view of a high-frequency semiconductor device disclosed in Japanese Unexamined Patent Application Publication No. 2003-124435. A multilayer ceramic substrate 102 includes elements such as resistors 108 and chip capacitors. Chip components 103 such as chip resistors and chip capacitors are disposed on the top surface of the multilayer ceramic substrate 102.

Semiconductor elements 101 such as transistors are provided on the bottom surface of the multilayer ceramic substrate 102. A composite resin layer 110 is provided on the bottom surface of the multilayer ceramic substrate 102 such that the semiconductor elements 101 are embedded in the composite resin layer 110. External connection electrodes 104 are provided on the bottom surface of the multilayer ceramic substrate 102 for connection to the electrical circuit of an external printed circuit board 120. The parts such as the semiconductor elements 101 are connected to the external connection electrodes 104 through conductive resins 112 which are via conductors passing through the composite resin layer 110. The external connection electrodes 104 are electrically connected to pad electrodes 121 provided on a main surface of the printed circuit board 120 through bonding members 122.

FIG. 21 illustrates problems in the background art. FIG. 21 is an enlarged sectional view around each external connection electrode 104. A resin layer, for example the composite resin layer 110, is bonded to the multilayer ceramic substrate 102 by heating and pressing a thermosetting resin sheet. The resin layer is bonded to the multilayer ceramic substrate 102 in a semi-solid state (prepreg state) so that the semiconductor elements 101 are embedded in the resin layer.

In the pressing of the resin layer against the multilayer ceramic substrate 102, however, the conductive resins 112, which have been provided inside the composite resin layer 110 in advance, readily protrude because the resin layer is softer than the multilayer ceramic substrate 102. This protrusion leads to the separation between the external connection electrodes 104 and the composite resin layer 110.

In addition, the resin layer containing the via conductors has a small thermal expansion coefficient, namely 11 to 16 ppm/° C., in comparison with that of the via conductors, namely 16 to 20 ppm/° C. When the via conductors and the resin layer rise in temperature, for example, in a reflow process, they differ in the amount of expansion. The via conductors, which expand more than the resin layer, protrude from the bottom surface of the resin layer to partially or completely delaminate the external connection electrodes from the resin layer. That is, the external connection electrodes and the resin layer are completely out of contact and the bonding strength therebetween decreases.

Such decreased bonding strength between the external connection electrodes and the resin layer allows only a slight external force to separate the external connection electrodes from the via conductors. This undesirably results in a defective contact.

If a force is applied in a direction in which the printed circuit board and the multilayer ceramic substrate separate from each other by, for example, dropping the electronic device, a tensile stress acts on the junctions between the external connection electrodes and the resin layer through the solder. In such a case, decreased bonding strength between the external connection electrodes and the resin layer undesirably leads to the delamination of the external connection electrodes and thus a defective contact therebetween.

A second stress tending to delaminate the external connection electrodes is caused by the condensation of solder during its solidification for bonding the multilayer ceramic substrate to a motherboard. In addition, when the external connection electrodes are subjected to Ni—Au plating, a reducing agent in a plating bath for Ni plating produces hydrogen ions which dissolve into Ni. The plating layers therefore solidify with expanded crystal lattices. Afterward, however, the dissolved hydrogen ions are diffused and released to contract the plating layers and decrease the volumes thereof. In the contraction, the plating layers are held by the underlying portions to leave a tensile stress which undesirably delaminates the external connection electrodes and thus causes a defective contact.

SUMMARY OF THE INVENTION

In order to overcome the problems described above, preferred embodiments of the invention provide a multilayer electronic component and its mounting structure that can prevent a defective contact between an external connection electrode and a via conductor.

A multilayer electronic component according to the present preferred embodiment includes a component body having a first main surface and a second main surface, a resin layer having a mounting surface and a contact surface bonded to the first main surface, a via conductor provided inside the resin layer, and an external terminal electrode disposed on the mounting surface so as to come in contact with the via conductor. The external terminal electrode has a first region on a main surface facing the mounting surface, and a second region on a main surface facing away from the mounting surface. The first region is connected to the via conductor while the second region is provided with a bonding member for connecting the external terminal electrode to a pad electrode on a motherboard. The second region is arranged such that, when the first region is projected through to the main surface facing away from the mounting surface, the center of the second region is spaced away from and does not overlap with a region in which the first region is projected. This structure can provide a multilayer electronic component that causes no defective contact between the external terminal electrode and the via conductor.

The second region is preferably arranged such that, when the first region is projected through to the main surface facing away from the mounting surface, the second region is spaced away from and does not overlap with the region in which the first region is projected. This structure can more effectively prevent a defective contact between the external terminal electrode and the via conductor.

Preferably, a plurality of the external terminal electrodes are provided, and the first regions thereof are arranged around a point on the mounting surface. This structure can nearly uniformly disperse a force applied to the first regions of the external terminal electrodes to more reliably prevent a defective contact between the external terminal electrodes and the via conductors.

Preferably, a plurality of the external terminal electrodes are provided, and the second regions thereof are arranged around a point on the mounting surface. This structure can nearly uniformly disperse a force applied to the second regions of the external terminal electrodes to more reliably prevent a defective contact between the external terminal electrodes and the via conductors.

The external terminal electrode preferably includes a land portion and a lead portion having a smaller width than the land portion. The first region is disposed on the lead portion while the second region is disposed on the land portion. This structure can prevent the bonding member from moving from the land portion toward the lead portion to more reliably prevent a defective contact between the external terminal electrode and the via conductor.

The component body preferably includes a multilayer ceramic substrate including laminated ceramic layers. The component body may also be, for example, a resin substrate, though the present preferred embodiment has more significant effects for a multilayer ceramic substrate.

The multilayer electronic component preferably further includes a first circuit element disposed inside the component body, a second circuit element disposed inside the resin layer, and an intermediate conductor disposed on the first main surface to electrically connect the first circuit element and the second circuit element. This structure can increase the number of circuit elements provided for the component body.

The multilayer electronic component preferably further includes a first circuit element disposed inside the component body, and a first circuit element disposed on the second main surface and electrically connected to the first circuit element. This structure allows the application of the present preferred embodiment to a multilayer electronic component including the first circuit element.

The multilayer electronic component preferably further includes a mold resin layer disposed on the second main surface so as to cover the first circuit element. This structure can facilitate the mounting of a multilayer electronic component onto, for example, a motherboard, and can also protect the first circuit element from, for example, impact.

The multilayer electronic component preferably further includes a metal case connected to the component body so as to cover the first circuit element. This structure can facilitate the mounting of a multilayer electronic component onto, for example, a motherboard, and can also protect the first circuit element from, for example, impact.

The multilayer electronic component preferably further includes a first circuit element disposed inside the component body, and a second circuit element disposed on the first main surface and electrically connected to the first circuit element. This structure allows the application of the present preferred embodiment to a multilayer electronic component including the second circuit element.

At least either a ground electrode or a dummy electrode is preferably provided on the first main surface. This structure allows the application of the present preferred embodiment to a multilayer electronic component including a dummy electrode or one including a ground electrode, such as a high-frequency semiconductor device.

In a structure for mounting the above-described multilayer electronic component according to the present preferred embodiment, the multilayer electronic component is connected to a motherboard for mounting the multilayer electronic component with the bonding member disposed therebetween. The bonding member is provided in the second region. This structure can prevent a defective contact between the external connection electrode and the via conductor.

The present preferred embodiment can provide a multilayer electronic component and its mounting structure that can prevent a defective contact between the external connection electrode and the via conductor.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

First Preferred Embodiment

Multilayer electronic components and structures for mounting the multilayer electronic components according to a first preferred embodiment of the present invention will now be described with reference to FIGS. 1 to 13. In the present invention, terms representing directions, such as "top" and "upper," indicate the relative positions of members, rather than absolute directions (for example, the vertical direction).

Figure 1:
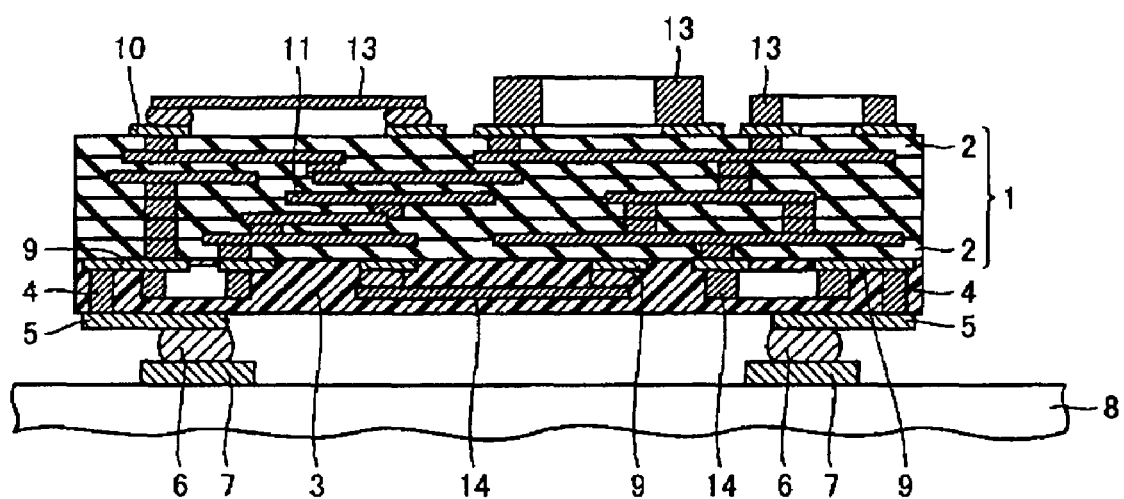
FIG. 1 is a schematic sectional view of a first multilayer electronic component according to a first preferred embodiment of the present invention.

FIG. 1 is a schematic sectional view of a first multilayer electronic component according to the present preferred embodiment. This multilayer electronic component includes a multilayer substrate 1 as a component body. The multilayer substrate 1 is, for example, a multilayer ceramic substrate produced by laminating and sintering ceramic layers 2 made of ceramic green sheets. First circuit elements 11, such as a capacitor and a resistor, are provided between the ceramic layers 2. The first circuit elements 11 are provided along the main surfaces of the ceramic layers 2. The first circuit elements 11 are electrically connected to each other according to need.

Land electrodes 10 are provided on the top main surface of the multilayer substrate 1 and are electrically connected to the first circuit elements 11. First circuit components 13, such as a capacitor and a resistor, are provided on the top main surface of the multilayer substrate 1 with the land electrodes 10 disposed therebetween. The first circuit components 13 are electrically connected to the land electrodes 10 through bonding members such as solder. The land electrodes 10 include those that electrically connect the first circuit components 13 to the first circuit elements 11 and those that connect the first circuit components 13 to each other.

Land electrodes 9 are provided on the bottom main surface of the multilayer substrate 1. The land electrodes 9 are electrically connected to second circuit components 14, such as a capacitor and a resistor. The land electrodes 9 include those that electrically connect the first circuit elements 11 to the second circuit components 14 and those that electrically connect the second circuit components 14 to each other. The second circuit components 14 are electrically connected to the land electrodes 9 through bonding members such as solder on the bottom main surface of the multilayer substrate 1.

A resin layer 3 is provided on the bottom main surface of the multilayer substrate 1. This resin layer 3 has a contact surface bonded to the multilayer substrate 1 and a mounting surface bonded to external terminal electrodes 5. Via conductors 4 are provided inside the resin layer 3 so as to pass through the resin layer 3 on the periphery thereof. These via conductors 4 are electrically connected to the land electrodes 9. The external terminal electrodes 5 are arranged on the mounting surface of the resin layer 3 to provide an external electrical connection. The external terminal electrodes 5 are preferably provided in a film form, for example. The external terminal electrodes 5 are brought into contact with and electrically connected to the via conductors 4. Bonding members 6 are bonded to the bottom of the external terminal electrodes 5. The bonding members 6 connect the multilayer electronic component including the multilayer substrate 1 and the resin layer to surface pad electrodes 7 provided on a motherboard 8 which is, for example, a printed circuit board. An electrical circuit provided on the motherboard 8 is connected to the surface pad electrodes 7.

Second circuit elements (not shown) are provided on the bottom main surface of the multilayer substrate 1. These second circuit elements are disposed between the resin layer 3 and the multilayer substrate 1. The second circuit elements are electrically connected to the first circuit elements 11 through an intermediate conductor provided on the bottom main surface of the multilayer substrate 1.

The resin layer 3 is preferably made of, for example, a thermosetting resin containing an inorganic filler. A proper amount of inorganic filler is added, for example, to adjust the thermal expansion coefficient of the resin layer or the liquidity of a semi-solid resin sheet. However, any other suitable material may be used for the layer 3. If the second circuit components 14 are not provided inside the resin layer, the resin layer has a thickness of, for example, about 10 μm to about 300 μm (preferably, about 0.01 to about 0.5 times the thickness of the multilayer substrate). If, on the other hand, the second circuit components 14 are provided inside the resin layer, the resin layer has a thickness of, for example, about 200 μm to about 1,000 μm (preferably, about 0.1 to about 2 times the thickness of the multilayer substrate). In the present preferred embodiment, the multilayer substrate preferably has a thickness of about 1 mm. These members are drawn with the thicknesses thereof changed for convenience in the individual drawings. The resin layer is a single layer in the present preferred embodiment, though a plurality of resin layers may also be laminated to each other.

The bonding members may be made of, for example, a thermosetting conductive adhesive or a thermal melting brazing material. The conductive adhesive may be, for example, a thermosetting adhesive, such as epoxy resin, containing a metal powder, such as silver. The brazing material may be any material that can be melted by, for example, heating and can electrically and mechanically connect the conductors. An example of the brazing material is solder.

Examples of the circuit components include active elements, such as transistors, ICs, and LSIs, and passive elements, such as chip thermistors and chip inductors. Examples of the circuit elements include capacitors, inductors, and resistors.

Figure 2A:
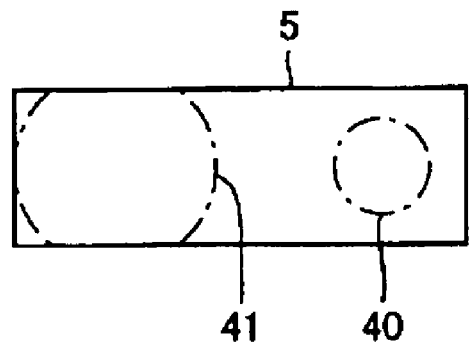
FIG. 2A is a plan view of an external terminal electrode of the first multilayer electronic component according to the first preferred embodiment of the present invention.

FIG. 2A illustrates an external terminal electrode. FIG. 2A is a plan view of an external terminal electrode 5. The external terminal electrode 5 preferably has a substantially rectangular shape in plan view. The external terminal electrode 5 has a main surface adjacent to the mounting surface of the resin layer 3 (the main surface bonded to the mounting surface) and the opposite main surface. The external terminal electrode 5 has a first region 40 on the surface bonded to the mounting surface and a second region 41 on the opposite main surface. The first region 40 is connected to the via conductors 4 while the second region 41 is connected to the bonding members.

As shown in FIG. 2A, the second region 41 is arranged such that, when the first region 40 is projected through to the opposite main surface, the center of the second region 41 is spaced from and does not overlap with a region in which the first region 40 is projected. Particularly in the present preferred embodiment, the second region 41 is arranged such that, when the first region 40 is projected through to the opposite main surface, the second region 41 is spaced from and does not overlap with the region in which the first region 40 is projected. In other words, the first region 40 and the second region 41 are arranged so as not to overlap with each other in perspective view in the direction perpendicular to the main surfaces of the external terminal electrode 5 (in the lamination direction of the ceramic layers). In the present preferred embodiment, the sectional shape of the via conductors 4, which is preferably circular, has a diameter smaller than the width of the external terminal electrode 5, and the first region 40 is provided in a perfect circle accordingly. The sectional shape of the via conductors 4 is not particularly limited to the above shape, it may also have a diameter larger than the width of the external terminal electrode 5. In addition, the sectional shape of the bonding members may have a diameter smaller than the width of the external terminal electrode 5, and the second region 41 may be provided in a circle accordingly.

Figure 2B:
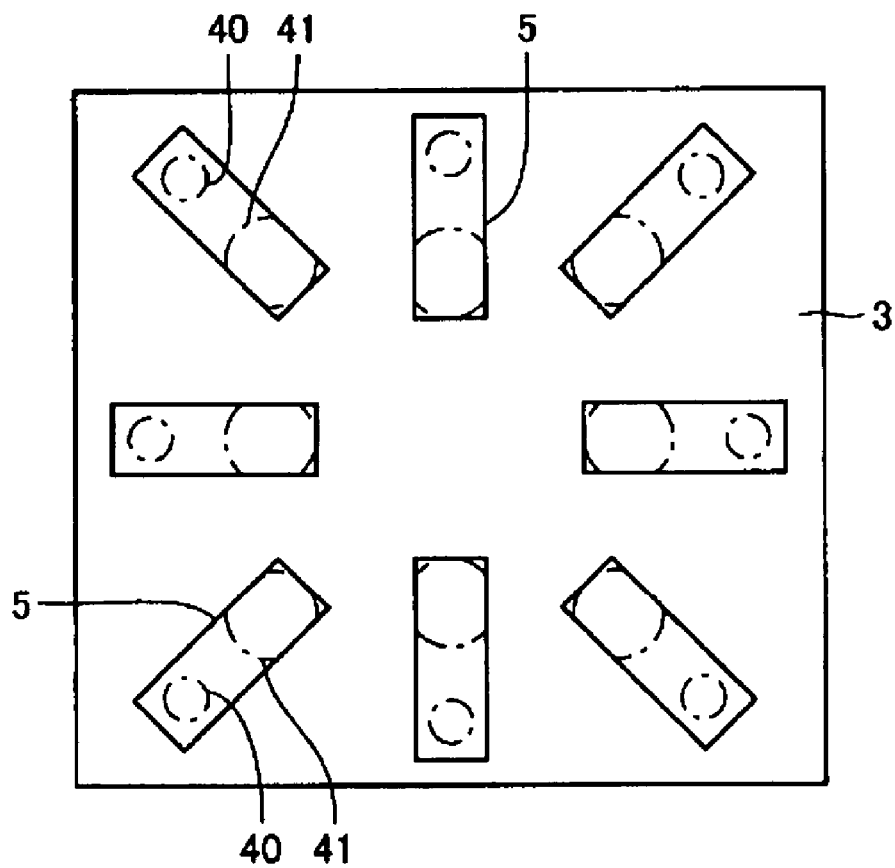
FIG. 2B is a schematic diagram showing the arrangement of external terminal electrodes of the first multilayer electronic component according to the first preferred embodiment of the present invention.

FIG. 2B illustrates the positions of the external terminal electrodes on the resin layer. FIG. 2B is a perspective view of the multilayer electronic component from the motherboard side. In the present preferred embodiment, the resin layer 3 is substantially square in plan view. The external terminal electrodes 5 are disposed such that the longitudinal directions thereof are directed toward the center of gravity of the square resin layer 3 in plan view. That is, the external terminal electrodes 5 are arranged radially around the center of gravity of the resin layer 3 in plan view. The first regions 40 of the external terminal electrodes 5 are disposed on the outside of the resin layer 3 while the second regions 41 are disposed on the inside of the resin layer 3.

The first regions 40 are arranged around the center of gravity of the mounting surface of the resin layer 3. The first regions 40 are arranged on the periphery of the mounting surface of the resin layer 3 such that they are substantially parallel with the outer edges of the mounting surface. Similarly, the second regions 41 are arranged around the center of gravity of the mounting surface of the resin layer 3. Though the first and second regions 40 and 41 are arranged around the center of gravity of the mounting surface in the present preferred embodiment, the arrangement thereof is not particularly limited to the above arrangement, they may be arranged around any point on the mounting surface.

Figure 3:
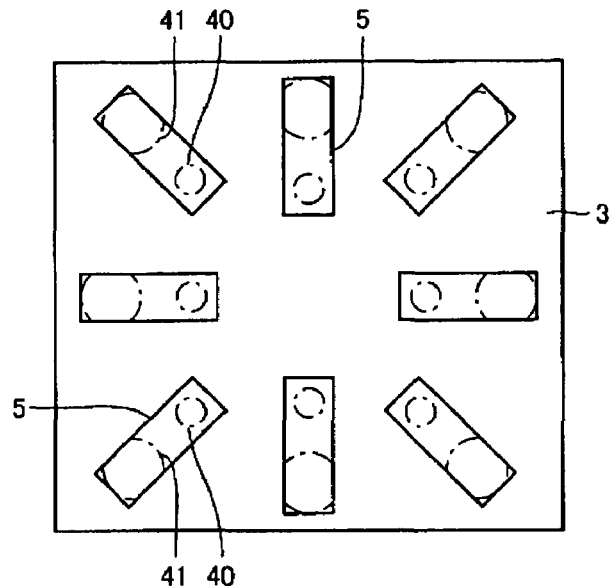
FIG. 3 is a schematic diagram of external terminal electrodes of a second multilayer electronic component according to the first preferred embodiment of the present invention.

FIG. 3 illustrates a second multilayer electronic component according to the present preferred embodiment. FIG. 3 is a perspective view of the second multilayer electronic component from the motherboard side, showing the positions of external terminal electrodes on a resin layer in the multilayer electronic component. The second multilayer electronic component preferably is identical to the first multilayer electronic component in that the external terminal electrodes 5 are arranged radially around the center of gravity of the resin layer 3 in plan view. In the second multilayer electronic component, the first regions 40 are disposed on the inner side of the second regions 41. The first and second regions 40 and 41 are arranged around the center of gravity of the mounting surface of the resin layer 3. Via conductors and bonding members, for example, are disposed such that the positions thereof correspond to the first and second regions 40 and 41, respectively. The rest of the structure is preferably the same as that of the first multilayer electronic component.

In the present preferred embodiment, as in the above-described preferred embodiment, the second regions 41 are larger than the first regions 40. If, therefore, the first regions 40 are disposed on the inside of the mounting surface and the second regions 41 are disposed on the outside of the mounting surface as in the present preferred embodiment, the second regions 41 can be arranged at a higher density to achieve a larger number of pins on the external terminal electrodes.

Figure 4:
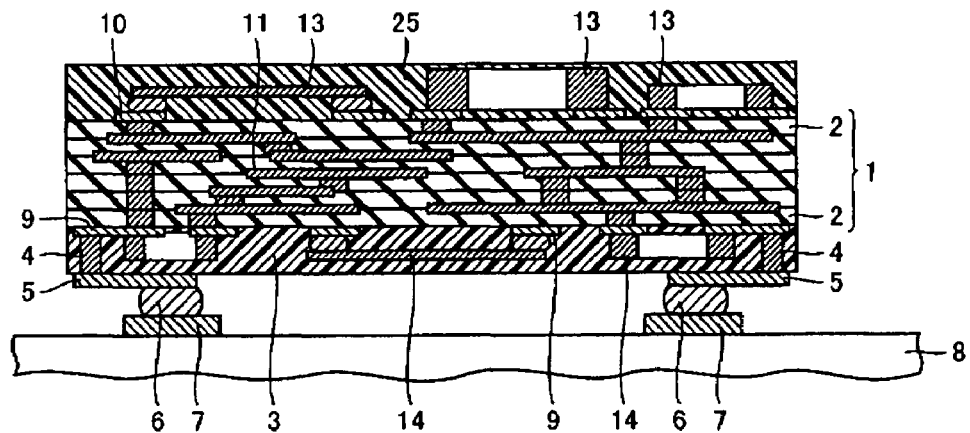
FIG. 4 is a schematic sectional view of a third multilayer electronic component according to the first preferred embodiment of the present invention.

FIG. 4 is a schematic sectional view of a third multilayer electronic component according to the present preferred embodiment. In addition to the structure of the first multilayer electronic component, the third multilayer electronic component includes a mold resin layer 25 disposed on the top main surface of the multilayer substrate 1. The mold resin layer 25 is arranged so as to cover the first circuit components 13 disposed on the top main surface of the multilayer substrate 1. The first circuit components 13 are completely embedded in the mold resin layer 25.

Figure 5:
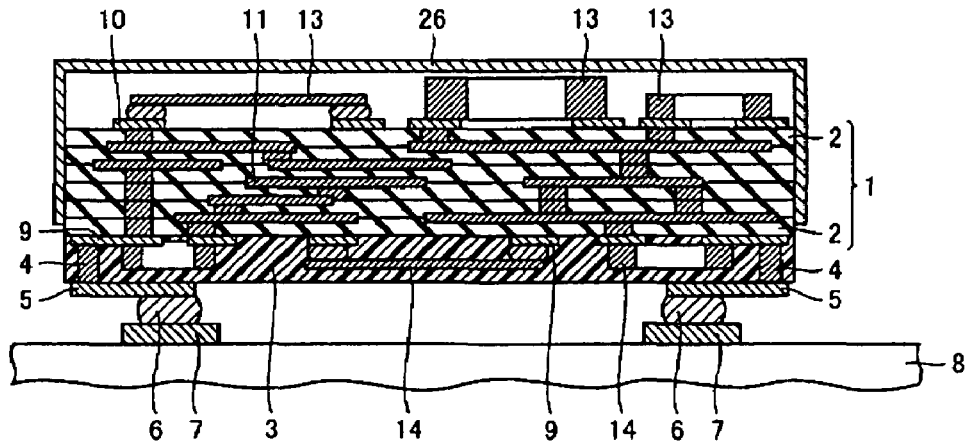
FIG. 5 is a schematic sectional view of a fourth multilayer electronic component according to the first preferred embodiment of the present invention.

FIG. 5 is a schematic sectional view of a fourth multilayer electronic component according to the present preferred embodiment. In addition to the structure of the first multilayer electronic component, the fourth multilayer electronic component has a metal case 26 fixed on the component body, namely the multilayer substrate 1. The metal case 26 is arranged so as to cover the first circuit components 13, which are disposed in a space enclosed between the metal case 26 and the multilayer substrate 1. The metal case 26 has a flat top surface.

Figure 6:
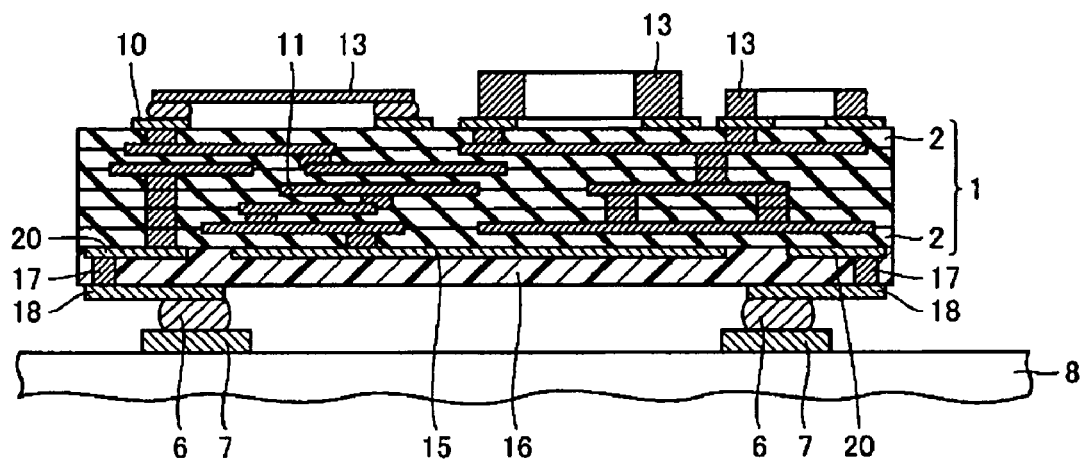
FIG. 6 is a schematic sectional view of a fifth multilayer electronic component according to the first preferred embodiment of the present invention.

FIG. 6 is a schematic sectional view of a fifth multilayer electronic component according to the present preferred embodiment. The fifth multilayer electronic component includes a ground electrode 15 provided on the bottom main surface of the multilayer substrate 1. The ground electrode 15 is electrically connected to the first circuit elements 11, and is separated from land electrodes 20 by a predetermined distance. A resin layer 16 is provided on the bottom main surface of the multilayer substrate 1. The fifth multilayer electronic component does not include any second circuit components inside the resin layer 16 in the present preferred embodiment. However, the layer may include second circuit components.

External terminal electrodes 18 are provided on the bottom main surface, namely the mounting surface, of the resin layer 16. The external terminal electrodes 18 are electrically connected to the land electrodes 20 through via conductors 17.

The fifth multilayer electronic component is preferably identical to the first multilayer electronic component in that the external terminal electrodes 18 have first regions in contact with the via conductors 17 and second regions in contact with the bonding members 6, that the second regions are disposed on the inner side of the first regions, and such that the first and second regions are arranged so as not to overlap with each other in perspective view. The rest of the structure of the fifth multilayer electronic component is preferably substantially the same as that of the first multilayer electronic component, and the description thereof will not be repeated.

In a structure for mounting any multilayer electronic component according to the present preferred embodiment, the multilayer electronic component is fixed on a motherboard for mounting the multilayer electronic component with bonding members disposed therebetween. The bonding members are provided in the second regions.

The multilayer electronic components according to the present preferred embodiment perform electrical processing through the first circuit elements disposed inside the multilayer substrate and the second circuit elements, the first circuit components, and the second circuit components provided on the main surfaces of the multilayer substrate. The electrical circuits of the multilayer electronic components are electrically connected to electrical circuits provided on the motherboard through the bonding members.

If the first multilayer electronic component shown in FIG. 1 rises in temperature, a difference in expansion coefficient between the via conductors 4 and the resin layer 3 may cause the via conductors 4 to protrude from the mounting surface of the resin layer 3. In the present invention, however, the via conductors 4 protrude at peripheral portions to which they are connected, and the other portion is bonded to the resin layer 3. This structure can therefore prevent the delamination of the external terminal electrodes 5 from the resin layer 3 and to keep them in contact with each other. That is, the large contact area and high bonding strength between the resin layer 3 and the external terminal electrodes 5 can prevent the delamination of the external terminal electrodes 5 from the resin layer 3.

As described above, the external terminal electrodes have the first region connected to the via conductors and the second region provided with the bonding members for connecting the external terminal electrodes to pad electrodes on a motherboard. The first region is disposed on the main surface facing the mounting surface of the resin layer while the second region is disposed on the main surface facing away from the mounting surface. The second region is arranged such that, when the first region is projected through the main surface facing away from the mounting surface, the center of the second region is spaced from and does not overlap with a region in which the first region is projected. This structure can prevent a defective contact between the external terminal electrodes and the via conductors. In addition, the second region may be arranged so as not to overlap with the region in which the first region is projected, thus preventing a defective contact between the external terminal electrodes and the via conductors more effectively. That is, the separation of the external terminal electrodes 5 from the resin layer 3 can be limited only to the vicinity of the first region, and remain bonded in the vicinity of the second region to prevent a defective contact between the external terminal electrodes and the via conductors.

The via conductors may include a larger amount of metal filler to increase the conductivity of the conductive paste for forming the via conductors. As a result, the adhesive content, namely the resin content, is decreased, thus degrading the adhesion between the via conductors and the external terminal electrodes. Consequently, the external terminal electrodes are more readily delaminated from the via conductors. Even in such a case, the multilayer electronic component according to the present preferred embodiment can prevent the delamination of the overall external terminal electrodes from the resin layer, and thus causes no defective contact between the external terminal electrodes and the via conductors.

Particularly, if a force tending to separate the motherboard and the multilayer is applied by, for example, a drop impact, a stress tending to delaminate the external terminal electrodes from the resin layer is applied through the bonding members. The multilayer electronic component according to the present preferred embodiment can prevent the delamination of the external terminal electrodes from the resin layer because the junctions therebetween, which have low bonding strength, are separated from positions to which the delaminating stress is applied.

In the multilayer electronic component according to the present preferred embodiment, as shown in FIG. 2B, the first regions are arranged around the center (center of gravity) of the mounting surface of the resin layer. This structure can disperse a force applied to the contact portions between the external terminal electrodes and the via conductors nearly uniformly over the bonding portions therebetween to prevent the separation of the external terminal electrodes more reliably. The point around which the first regions are arranged is not particularly limited to the center of gravity, and any point may be selected.

Also, the second regions are arranged around the center (center of gravity) of the mounting surface of the resin layer. This structure can nearly uniformly distribute a force applied between the external terminal electrodes and the bonding members. The multilayer electronic component can therefore prevent the concentration of a force applied between the external terminal electrodes and the via conductors or the resin layer through the bonding members onto a specific position to prevent a defective contact between the via conductors and the external terminal electrodes more reliably. The point around which the second regions are arranged is not particularly limited to the center of gravity, and any point may be selected.

In the present preferred embodiment, the multilayer substrate, as the component body, includes the multilayer ceramic substrate including the laminated ceramic layers. The component body may also be, for example, a resin substrate. The present preferred embodiment, however, has more significant effects if the component body is a rigid substrate, such as a multilayer ceramic substrate, which causes the via conductors to protrude more.

The first multilayer electronic component according to the present preferred embodiment includes the first circuit elements disposed inside the component body, the second circuit elements disposed inside the resin layer, and the intermediate conductor for electrically connecting the first circuit elements and the second circuit elements. This structure can include a larger number of circuit elements. An example of the intermediate conductor is patterned copper wiring.

Similarly, the multilayer electronic component includes the first and second circuit components disposed on the main surfaces of the multilayer substrate and electrically connected to the first circuit elements. This structure can include a larger number of electronic components.

The operation and effects of the second multilayer electronic component shown in FIG. 3 are the same as those of the first multilayer electronic component, and the description thereof will not be repeated The third multilayer electronic component shown in FIG. 4 includes the mold resin layer arranged so as to cover the first circuit components. This structure can prevent damage to the first circuit components when the multilayer electronic component is mounted on the motherboard. In addition, the mold resin layer can protect the first circuit components after the completion of the product.

The fourth multilayer electronic component shown in FIG. 5 includes the metal case arranged so as to cover the first circuit components. The metal case can protect the first circuit components, as in the case of the third multilayer electronic component. In addition, the metal case can facilitate the use of a device for mounting the multilayer electronic component onto the motherboard, such as a mounter. The metal case is preferably made of nickel silver or phosphor bronze in view of processability and cost.

The fifth multilayer electronic component shown in FIG. 6 includes the ground electrode provided on the bottom main surface of the multilayer substrate. This structure allows the application of the present preferred embodiment to a multilayer electronic component requiring a ground electrode. The present preferred embodiment can be applied to, for example, a multilayer electronic component for high frequencies. In addition, the ground electrode can be brought extremely close to the land electrodes to enhance the characteristics of a high-frequency electronic component.

The ground electrode is preferably an electrode provided by sintering rather than copper foil. That is, the ground electrode is preferably provided directly on the multilayer substrate in the step of forming an LTCC substrate described later. Sintered metals have a surface roughness Rmax of tens of micrometers, which is an order of magnitude greater than the surface roughness Rmax of copper foil, namely several micrometers. When bonded to the resin layer, therefore, a sintered metal electrode has an anchor effect to increase the bonding strength between the resin layer and the multilayer substrate. The difference in surface roughness results from pores remaining inside and on the surface of a sintered metal. These pores are left after evaporation of a resin called a varnish contained in the sintered metal during firing, while copper foil is provided by plating or rolling a copper sheet.

To make use of the above-described difference in surface roughness, a dummy electrode (an electrode with no electrical connection to the first circuit elements) may be disposed on the bottom surface of the multilayer substrate if the ground electrode is unnecessary in terms of the function of the electrical component. This structure can provide extremely high bonding strength between the multilayer substrate and the resin layer.

The ground electrode is preferably provided between the resin layer and the multilayer substrate. The ground electrode, however, is difficult to dispose on the bottom surface of the multilayer substrate if other wiring is disposed to achieve high-density mounting or a pore is provided for measurement (for example, a pore for inserting a probe). In such cases, the ground electrode may be disposed at a different position.

In a structure for mounting the multilayer electronic components according to the present preferred embodiment, the multilayer electronic components may be disposed on, for example, a motherboard. This mounting structure causes no defective contact between the external terminal electrodes and the via conductors. Other operations and effects are the same as those of the above multilayer electronic components, and the description thereof will not be repeated.

A method for producing the multilayer electronic components according to the various preferred embodiments will now be described with reference to FIGS. 7 to 13.

First, main surfaces of resin films such as PET are coated with ceramic slurry, and the coatings are dried to form ceramic green sheets having a thickness of about 10 μm to about 200 μm, for example.

These ceramic green sheets are perforated using a mold or a laser to form via holes having a diameter of about 0.1 mm, for example.

The via holes are filled with an electrode paste prepared by mixing a metal powder mainly containing silver or copper, a resin, and an organic solvent, and the paste is dried. Subsequently, for example, the electrode paste is applied to main surfaces of the ceramic green sheets in a predetermined pattern by a method such as screen printing, and the applied paste is dried. Also, land electrodes for connecting, for example, circuit components are provided with the electrode paste on surfaces that are to be the main surfaces of a multilayer substrate.

Figure 7:
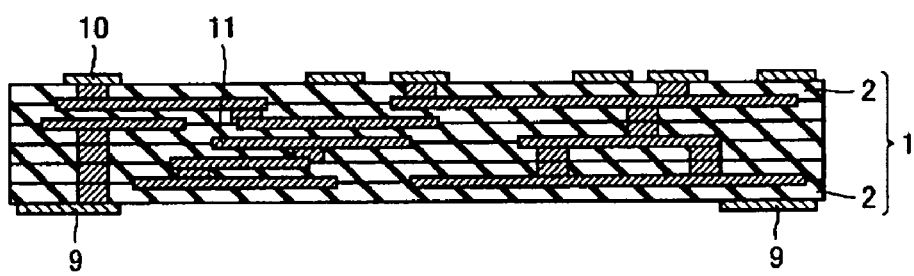
FIG. 7 is a first process view of a method for producing the multilayer electronic component according to the first preferred embodiment of the present invention.

Referring to FIG. 7, the ceramic green sheets, each having a printed pattern, are laminated and compacted at about 100 kg/cm$^2$ to about 1,500 kg/cm$^2$ and about 40° C. to about 100° C., for example, to form the multilayer substrate 1 including the ceramic layers 2. If the electrode paste is Ag-based, the multilayer substrate 1 is fired at about 850° C. in an air atmosphere, for example. If, on the other hand, the electrode paste is Cu-based, the multilayer substrate 1 is fired at about 950° C. in a $N_2$ atmosphere, for example.

If necessary, the land electrodes 9 and 10 provided on the main surfaces of the multilayer substrate 1 are plated with, for example, Ni/Sn or Ni/Au by a wet process. Thus, the multilayer substrate 1 (an LTCC substrate, namely a multilayer ceramic substrate) shown in FIG. 7 is provided. Subsequently, second circuit components are mounted on the bottom of the multilayer substrate 1.

On the other hand, a resin layer to be bonded to the multilayer substrate is produced. First, a copper foil having a thickness of about 10 μm to about 40 μm, for example, is bonded to a main surface of a support. This copper foil is patterned, for example, by applying a photoresist, exposure, development, etching, and removing the resist. The copper foil provides external terminal electrodes. The external terminal electrodes are provided at the positions corresponding to via conductor positions.

Figure 8:
FIG. 8 is a second process view of the method for producing the multilayer electronic component according to the first preferred embodiment of the present invention.

Referring to FIG. 8, via holes for forming via conductors are provided by, for example, a laser in a resin sheet prepared by mixing a thermosetting resin (such as epoxy resin, phenol resin, and cyanate resin) and an inorganic filler (such as $Al_2O_3$, $SiO_2$, and $TiO_2$). The via holes are filled with solder or a conductive resin (prepared by mixing metal particles such as Au, Ag, Cu, and Ni and a thermosetting resin such as epoxy resin, phenol resin, and cyanate resin).

Figure 9:
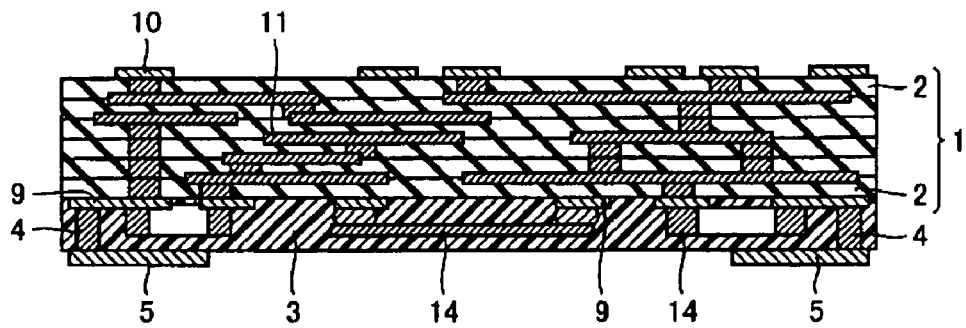
FIG. 9 is a third process view of the method for producing the multilayer electronic component according to the first preferred embodiment of the present invention.

Referring to FIG. 9, the copper foil, the resin sheet, and the multilayer substrate are positioned and laminated by heating and pressing.

Figure 10:
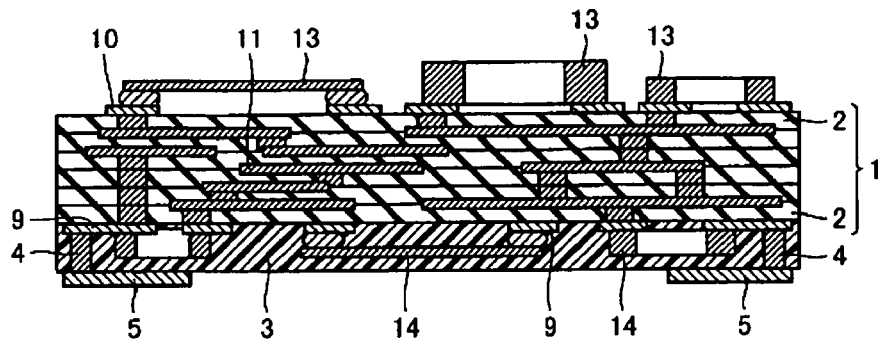
FIG. 10 is a fourth process view of the method for producing the multilayer electronic component according to the first preferred embodiment of the present invention.

Referring to FIG. 10, the first circuit components 13 are attached to the side of the multilayer substrate opposite the resin layer 3. In the attachment of the first circuit components 13, for example, surface-mount devices (SMDs) are attached with solder or a conductive resin, or integrated circuits (ICs), semiconductor devices, or surface acoustic wave (SAW) filters having solder bumps are attached. Alternatively, such components are fixed on the multilayer substrate 1 and are electrically connected by wire bonding with, for example, Au wires, Al wires, or Cu wires.

Figure 11:
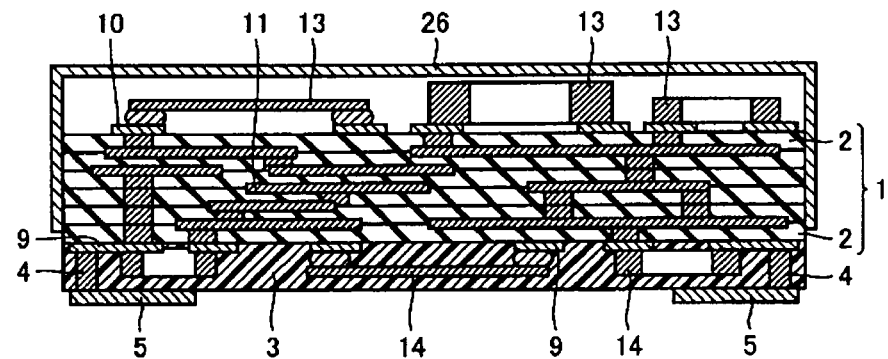
FIG. 11 is a fifth process view of the method for producing the multilayer electronic component according to the first preferred embodiment of the present invention.
Figure 12:
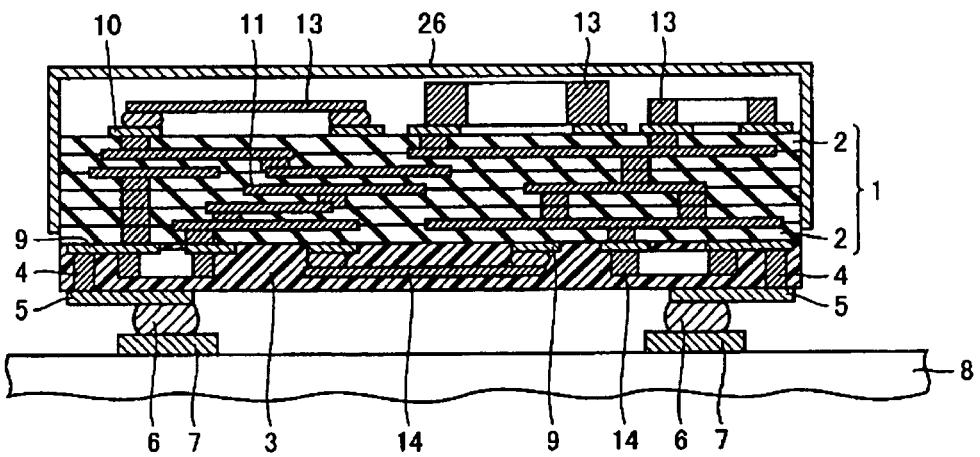
FIG. 12 is a sixth process view of the method for producing the multilayer electronic component according to the first preferred embodiment of the present invention.

Referring to FIG. 11, a metal case 26 is fixed on the multilayer substrate 1. Referring to FIG. 12, finally, the resultant multilayer electronic component is attached to the motherboard 8 with the bonding members 6 disposed therebetween.

As shown in FIG. 12, the copper foil providing the external terminal electrodes is preferably provided only on one side of the multilayer electronic component. In addition, no solder fillets are preferably provided when the multilayer electronic component is mounted on, for example, a motherboard. Land grid array (LGA), for example, is preferred for its simple structure, ease of production, and low cost.

If the resin layer has through-holes filled with solder, a known reflow process is provided to bond the resin layer to the electrodes or the copper foil on the bottom of the LTCC substrate. Specifically, a laminate of the resin layer and the LTCC substrate may be mounted on a motherboard by the reflow process. Alternatively, the resin layer, the LTCC substrate, and the motherboard may be bonded at the same time by the reflow process.

In addition, a second production method may be applied in which a thermosetting resin is provided and solidified on the overall surfaces of the multilayer substrate to embed the first circuit components or the second circuit components. In this method, the resin provided on a first main surface of the multilayer substrate preferably has substantially the same thermal expansion coefficient as that provided on the second main surface. This method can prevent the multilayer substrate from bending or cracking in the subsequent lamination step.

Figure 13:
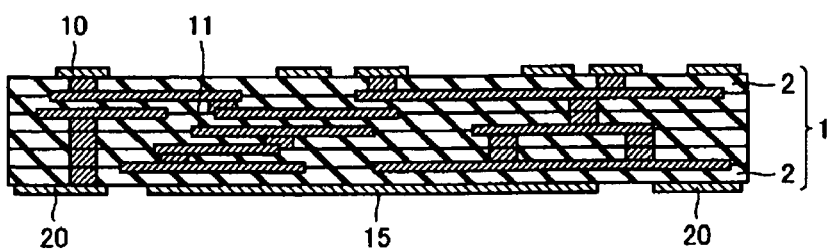
FIG. 13 illustrates a method for producing a multilayer electronic component including a ground electrode according to the first preferred embodiment of the present invention.

As described above, the ground electrode included in the multilayer electronic component is preferably provided by sintering. In the production process, as shown in FIG. 13, a sintered metal for forming the ground electrode 15 is preferably bonded to the multilayer substrate 1 in advance before firing.

Second Preferred Embodiment

Multilayer electronic components and structures for mounting the multilayer electronic components according to a second preferred embodiment of the present invention will now be described with reference to FIGS. 14 to 17B.

The multilayer electronic components according to the present preferred embodiment include a component body, a resin layer, via conductors, external terminal electrodes, and bonding members, as in the case of those of the first preferred embodiment. The multilayer electronic components according to the present preferred embodiment are characterized by the shapes of the external terminal electrodes.

Figure 14:
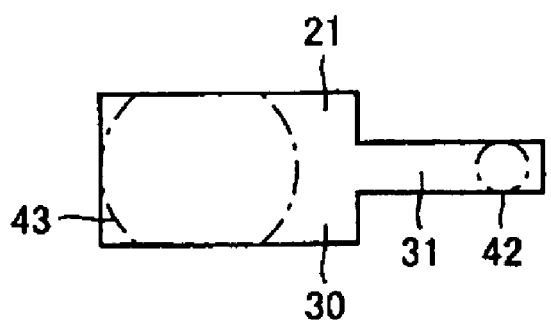
FIG. 14 is a schematic diagram of a first multilayer electronic component according to a second preferred embodiment of the present invention.

FIG. 14 is a plan view of an external terminal electrode included in a first multilayer electronic component according to the present preferred embodiment. An external terminal electrode 21 is preferably provided in a sheet form. This external terminal electrode 21 includes a land portion 30 and a lead portion 31 having a smaller width than the land portion 30. The land portion 30 and the lead portion 31 preferably have a substantially rectangular shape in plan view, for example. The lead portion 31 has a first region 42 for connection to the via conductors while the land portion 30 has a second region 43 for connection to the bonding members. The first region 42 is disposed substantially at the end of the lead portion 31 while the second region 43 is disposed substantially at the end of the land portion 30.

The first region 42 is disposed on a main surface of the external terminal electrode 21 facing the mounting surface of the resin layer (a main surface bonded to the resin layer) while the second region 43 is disposed on a main surface facing away from the above mounting surface. The second region 43 is disposed such that, when the first region 42 is projected through to the opposite main surface, the second region 43 is spaced from and does not overlap with a region in which the first region 42 is projected. In the present preferred embodiment, particularly, the first region 42 and the second region 43 are disposed substantially at the ends of the external terminal electrode 21 so that they are separated by a longer distance.

Figure 15:
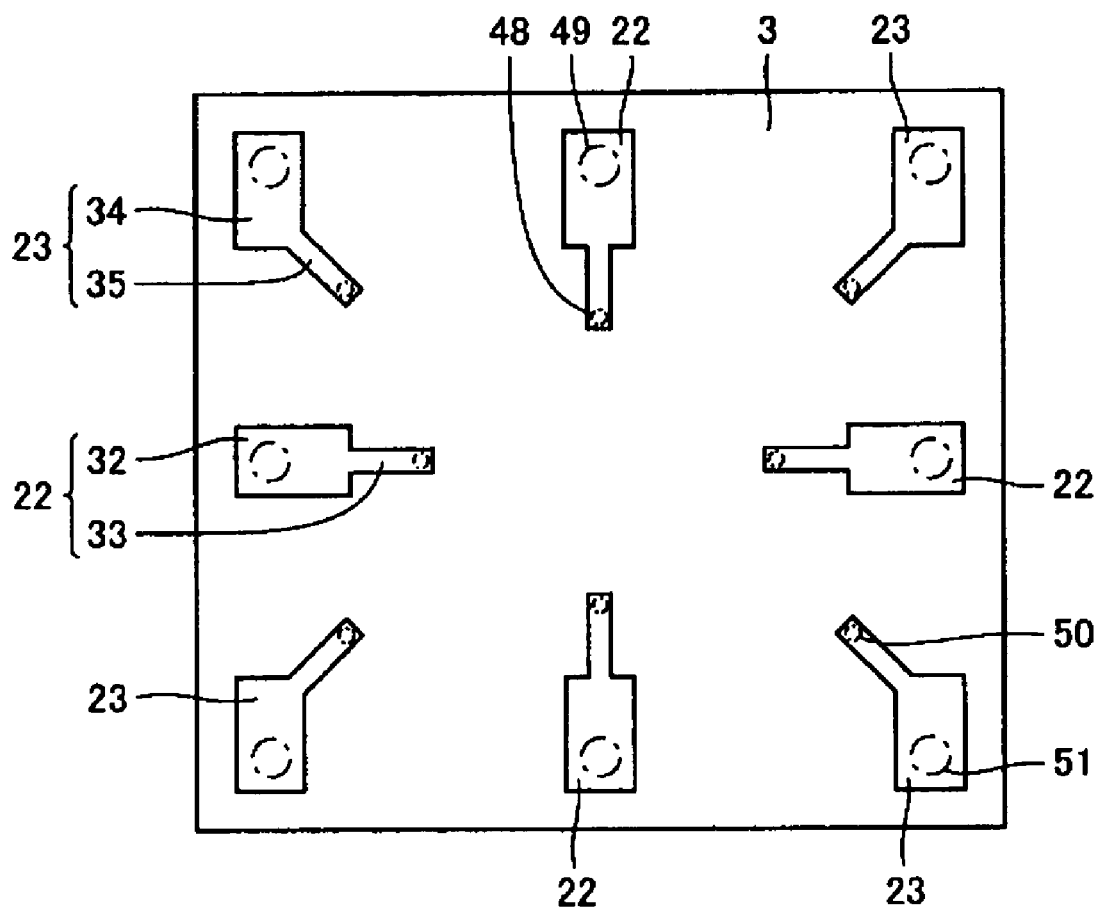
FIG. 15 is a schematic diagram of a second multilayer electronic component according to the second preferred embodiment of the present invention.

FIG. 15 illustrates a second multilayer electronic component according to the present preferred embodiment. FIG. 15 is a plan view showing the positions and shapes of external terminal electrodes on a resin layer. The second multilayer electronic component includes external terminal electrodes 22 and 23. The resin layer 3 has, for example, a substantially rectangular shape in cross-section. The external terminal electrodes 22 are disposed substantially in the centers of the sides of the substantially rectangular resin layer 3 while the external terminal electrodes 23 are disposed at the corners of the substantially rectangular resin layer 3.

The external terminal electrodes 22 include a land portion 32 having a substantially rectangular shape in plan view and a lead portion 33 that has a substantially rectangular shape in plan view and protrudes substantially perpendicularly from a side of the substantially rectangular land portion 32 in the longitudinal direction of the lead portion 33. On the other hand, the external terminal electrodes 23 include a land portion 34 having a substantially rectangular shape in plan view and a lead portion 35 that has a substantially rectangular shape in plan view and protrudes from a corner of the substantially rectangular land portion 34. The external terminal electrodes 22 and 23 are arranged such that the land portions 32 and 34 are directed to the outside of the resin layer 3 and the lead portions 33 and 35 are directed to the inside of the resin layer 3.

The lead portions 33 and 35 have a smaller width than the land portions 32 and 34. The width of the lead portions 33 and 35 preferably is substantially the same as the diameter of the via conductors in cross-section. The land portions 32 and 34 have second regions 49 and 51, respectively, while the lead portions 33 and 35 have first regions 48 and 50, respectively. The first regions 48 and 50 and the second regions 49 and 51 are arranged so as not to overlap with each other in perspective view in the direction that is substantially perpendicular to the main surfaces of the external terminal electrodes, as in the case of the multilayer electronic components according to the first preferred embodiment.

In the second multilayer electronic component, the lead portions 33 and 35 of the external terminal electrodes 22 and 23 are arranged radially around the center of gravity of the resin layer 3, which is substantially rectangular in cross-section. The land portions 32 and 34 are arranged along the outer edges of the substantially rectangular resin layer 3 so as to surround the center of gravity of the resin layer 3, which is also rectangular in plan view.

Figure 16:
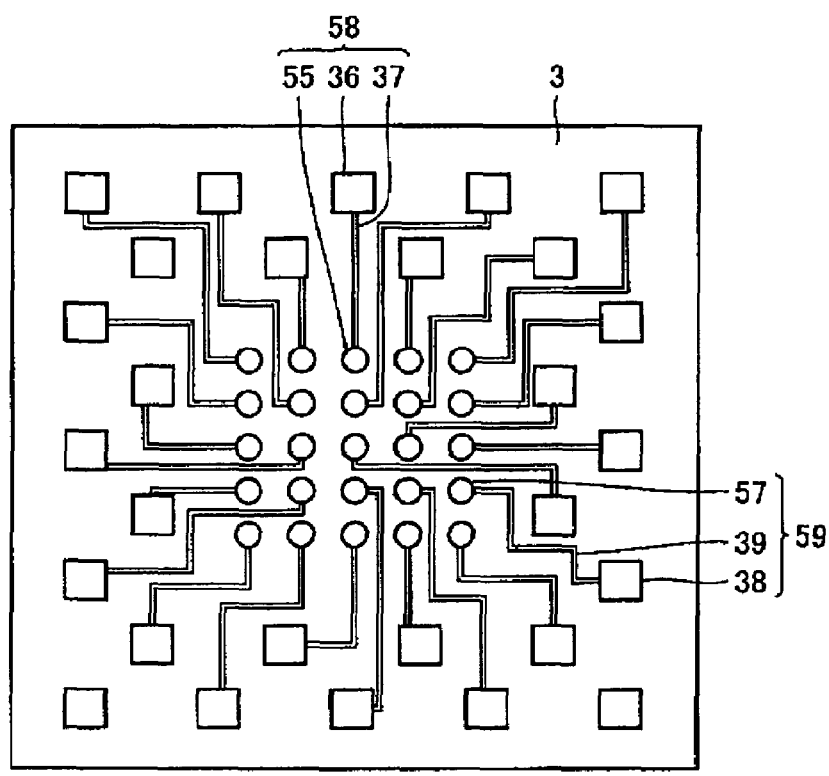
FIG. 16 is a schematic diagram of a third multilayer electronic component according to the second preferred embodiment of the present invention.

FIG. 16 illustrates a third multilayer electronic component according to the present preferred embodiment. FIG. 16 is a plan view showing the positions and shapes of external terminal electrodes on a resin layer. External terminal electrodes 58 include a land portion 36, a lead portion 37 having a smaller width than the land portion 36, and a via conductor connection 55 for connecting the via conductors at the end of the lead portion 37. The via conductor connection 55 is substantially circular in plan view, and the land portion 36 is substantially rectangular in plan view.

Similarly, external terminal electrodes 59 include a land portion 38, a lead portion 39, and a via conductor connection 57. The lead portion 39 is bent at a plurality of points while the lead portion 37 of the external terminal electrode 58 is straight. The land portions 36 and 38 and the via conductor connections 55 and 57, which are separated, are electrically connected through the lead portions 37 and 39, respectively.

The via conductor connections 55 and 57 have a first region for connection to the via conductors while the land portions 36 and 38 have a second region for connection to the bonding members.

The land portions 36 and 38 of the third external terminal electrodes are disposed on the outside of the resin layer 3 while the via conductor connections 55 and 57 are disposed on the inside of the resin layer 3. The via conductor connections 55 and 57 are concentrated in the center of the resin layer 3 in plan view while the land portions 36 and 38 are disposed on the periphery of the resin layer 3 in plan view.

The rest of the structure is preferably the same as that of the multilayer electronic components according to the first preferred embodiment, and the description thereof will not be repeated.

Figure 17A:
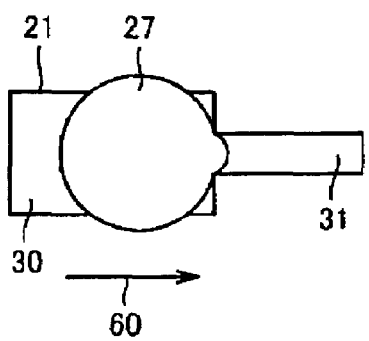
FIG. 17A illustrates the operation and effects of the multilayer electronic component according to the second preferred embodiment of the present invention.
Figure 17B:
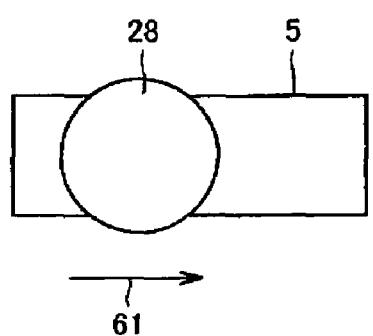
FIG. 17B illustrates the operation and effects of the multilayer electronic component according to the second preferred embodiment of the present invention.

FIGS. 17A and 17B illustrate the operation and effects of the multilayer electronic components according to the present preferred embodiment. FIGS. 17A and 17B are plan views showing the operation and effects of the external terminal electrode 21 among the three types of external terminal electrodes in the present preferred embodiment. The other types of external terminal electrodes provide the same operation and effects.

FIG. 17B illustrates an external terminal electrode according to the first preferred embodiment and a bonding member provided thereon. A bonding member 28 provided on a main surface of the external terminal electrode 5 may move in a direction indicated by an arrow 61 depending on how a force is applied. If, for example, the bonding member 28 is made of a brazing material such as solder, it may spread or move when melted. As a result, the first and second regions may come extremely close to each other, or may overlap with each other on the top and bottom main surfaces.

FIG. 17A illustrates an external terminal electrode according to the present preferred embodiment and a bonding member provided thereon. A bonding member 27 can move in a direction indicated by an arrow 60 on the land portion 30, which has a large width. The bonding member 27, however, is prevented from moving toward the lead portion 31, which has a small width, by surface tension because the radius of curvature of the bonding member 27 decreases partially. Consequently, the bonding member 27 hardly moves onto the lead portion 31. That is, the second region, namely the region bonded to the bonding member 27, can be prevented from moving toward the first region provided on the lead portion 31. Thus the land portion and the lead portion, which has a smaller width than the land portion, can prevent the second region from approaching the first region.

The land portions of the external terminal electrodes shown in FIG. 16 may be disposed on the periphery of the resin layer to, for example, facilitate the visual inspection of soldered contact points. If the land portions are disposed on the inside of the surface of the resin layer, an external impact has a larger moment. If, on the other hand, the land portions are disposed on the periphery of the surface of the resin layer, the moment can be inhibited to prevent breakage. In addition, the via conductor connections can be disposed inside to prevent the cracking of the resin layer and chipping from occurring when the multilayer electronic component is mounted on a motherboard, thus providing higher reliability.

In addition, the land portions 36 and 38 of the external terminal electrodes shown in FIG. 16 may be disposed on the periphery of the resin layer 3 while the via conductor connections 55 and 57 may be disposed on the inside of the resin layer 3. Because the external terminal electrodes are preferably disposed on the periphery of the resin layer, the via conductors for connection to the external terminal electrodes are positioned on the periphery accordingly. For the external terminal electrodes according to the present preferred embodiment, however, the land portions and the via conductor connections can be disposed at any positions to enhance design flexibility and increase the number of the external terminal electrodes.

A delaminating force acts on the external terminal electrodes by, for example, the contraction of solder, namely the bonding member, when they are bonded to a motherboard or by residual tensile stress after Ni—Au plating. If the force separates the external terminal electrodes and the via conductors, a defective contact occurs. This force increases in proportion to the area of the external terminal electrodes. In the present invention, the bonding positions of the via conductors are separated from those of the bonding members. The width of the regions bonded to the via conductors can therefore be reduced to nearly the diameter of the via conductors in cross-section, as in the present preferred embodiment. Accordingly, the above delaminating force can be significantly reduced to prevent a defective contact between the via conductors and the external terminal electrodes.

Third Preferred Embodiment

A multilayer electronic component and a structure for mounting the multilayer electronic component according to a third preferred embodiment of the present invention will now be described with reference to FIGS. 18 to 19B.

The multilayer electronic component according to the present preferred embodiment includes a component body, a resin layer, via conductors, external terminal electrodes, and bonding members, as in the case of those of the first preferred embodiment. The multilayer electronic component according to the present preferred embodiment includes a resist provided on the surfaces of the external terminal electrodes.

Figure 18:
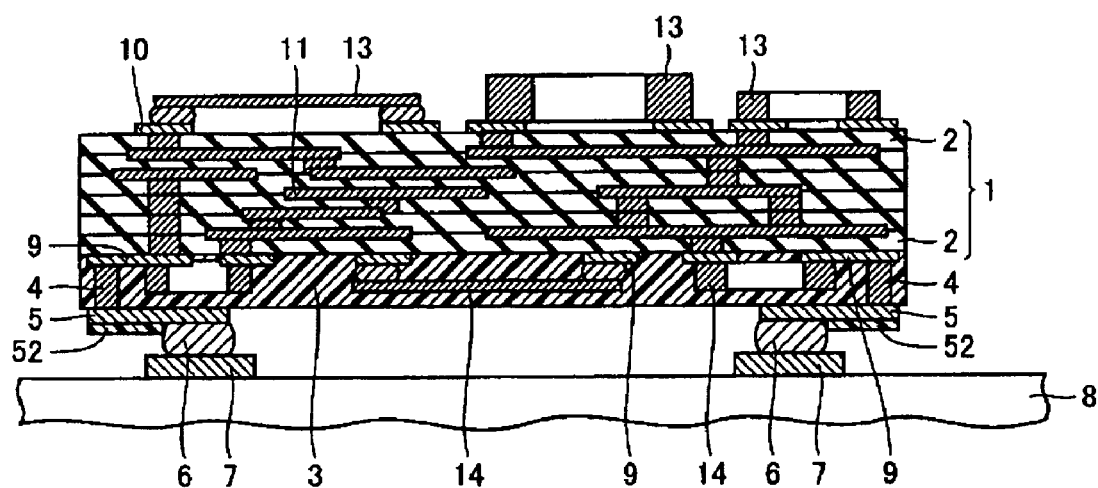
FIG. 18 is a schematic sectional view of a multilayer electronic component according to a third preferred embodiment of the present invention.

FIG. 18 is a schematic sectional view of the multilayer electronic component according to the present preferred embodiment, in which a resist 52 is provided on main surfaces of the external terminal electrodes on which the bonding members 6 are disposed.

Figure 19A:
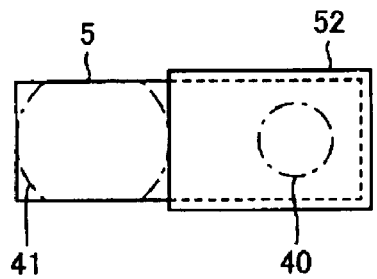
FIG. 19A is a plan view of an external connection electrode of the multilayer electronic component according to the third preferred embodiment of the present invention.
Figure 19B:
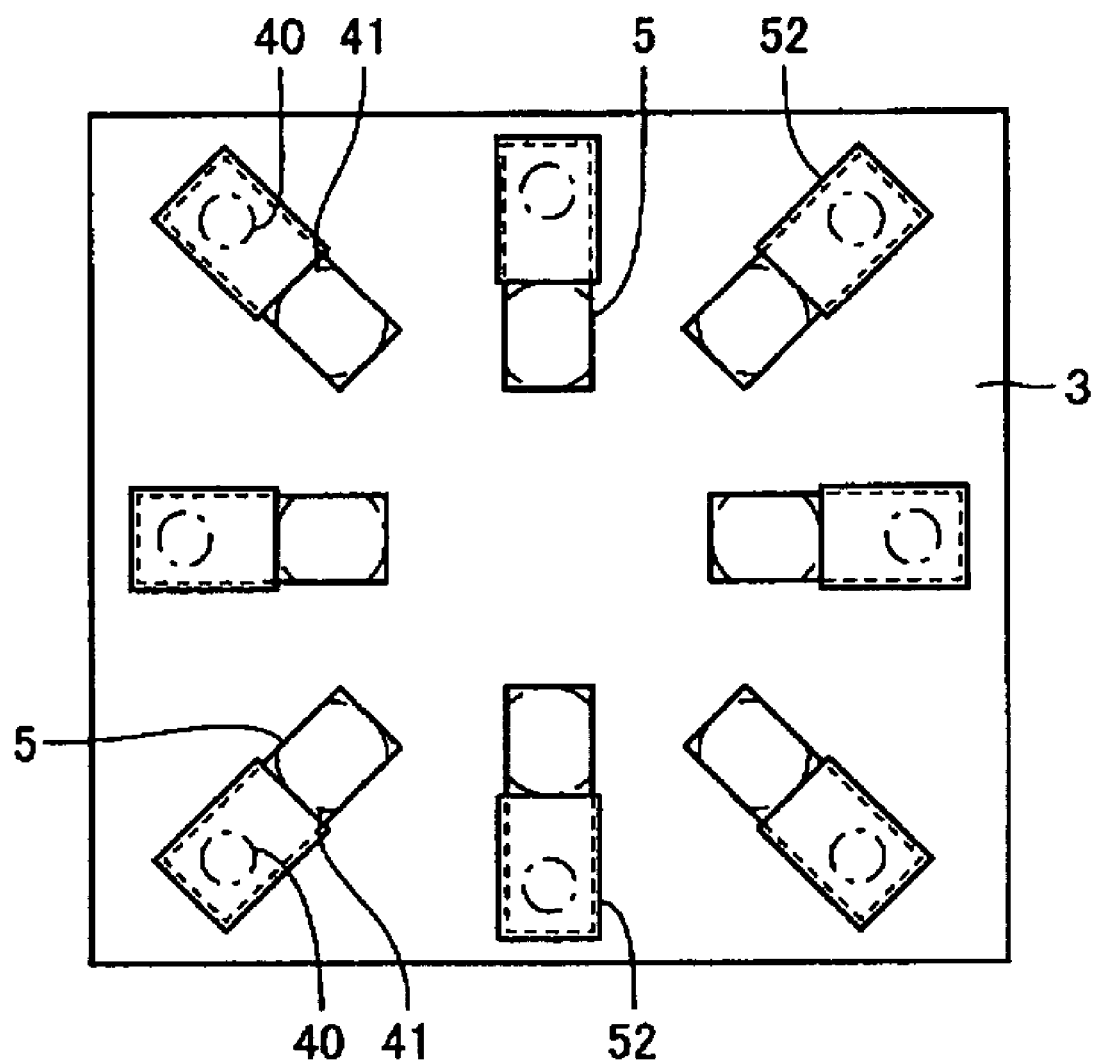
FIG. 19B is a schematic diagram showing the arrangement of external terminal electrodes according to the third preferred embodiment of the present invention.
Figure 20:
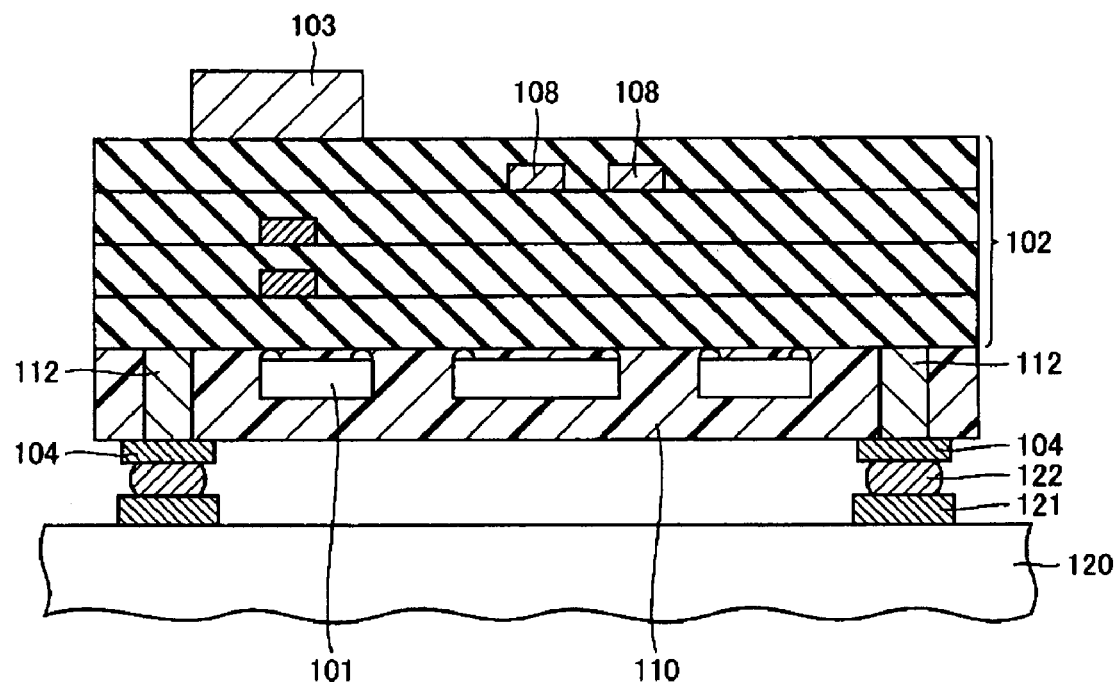
FIG. 20 is a schematic sectional view of a high-frequency semiconductor device in the related art.
Figure 21:
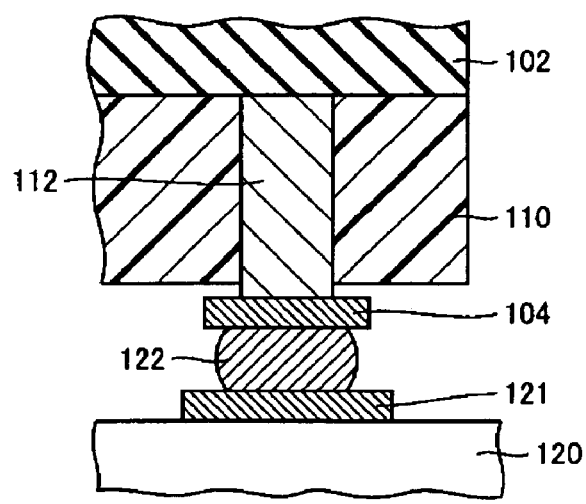
FIG. 21 is a schematic sectional view illustrating the problems of the high-frequency semiconductor device in the related art.

FIGS. 19A and 19B illustrate external terminal electrodes. FIG. 19A is a plan view of an external connection electrode. FIG. 19B is a perspective view showing the arrangement of external terminal electrodes on a resin layer from the motherboard side.

The external terminal electrodes 5 preferably have a substantially rectangular shape in plan view. The resist 52 is arranged so as to cover the region other than the second region 41. The resist 52 preferably has a substantially rectangular shape in plan view. In the present preferred embodiment, the resist 52 is a solder resist.

Referring to FIG. 18, the resist may be arranged on the surfaces of the external terminal electrodes to prevent the bonding members 6 from wetting and spreading toward the via conductors 4. That is, the resist limits the second region 41 to prevent a defective contact between the external terminal electrodes and the via conductors more effectively.

The shape of the resist, which is preferably substantially rectangular in plan view in the present preferred embodiment, is not particularly limited to that shape, and any shape may be selected. For example, the resist may be provided in the overall region other than the second region. In addition, the resist is provided on all external terminal electrodes in the present preferred embodiment, though the present invention is not particularly limited to this arrangement, the resist may also be provided only on some external terminal electrodes.

Other structures, operations, and effects are the same as the multilayer electronic components according to the first and second preferred embodiments, and the description thereof will not be repeated.

The preferred embodiments disclosed above are mere examples, and thus are nonrestrictive in all respects. The scope of the present invention is indicated by the claims, rather than by the above description, and includes all modifications within the meaning and range of equivalents of the claims.

While the present invention has been described with respect to preferred embodiments thereof, it will be apparent to those skilled in the art that the disclosed invention may be modified in numerous ways and may assume many preferred embodiments other those specifically set out and described above. Accordingly, it is intended by the appended claims to cover all modifications of the present invention which fall within the true spirit and scope of the invention.

The invention claimed is:

1. A multilayer electronic component comprising:
 a component body having a first main surface and a second main surface;
 a resin layer having a contact surface and a mounting surface, the contact surface being attached to the first main surface of the component body;
 a via conductor provided inside the resin layer, the via conductor being filled with one of solder or a conductive resin; and
 an external terminal electrode disposed on the mounting surface so as to contact the via conductor, the external terminal electrode having a first region on a surface facing the mounting surface and connected to the via conductor, and a second region on a surface facing away from the mounting surface provided with a bonding member arranged to connect the external terminal electrode to a pad electrode on a motherboard; wherein
 the second region is arranged such that, when the first region is projected through to the surface facing away from the mounting surface, the second region is spaced from and does not overlap with a region in which the first region is projected; and
 the first region of the external terminal electrode is spaced from the bonding member so as not to be connected to the pad electrode.

2. The multilayer electronic component according to claim 1, wherein a center of the second region does not overlap with the region in which the first region is projected.

3. The multilayer electronic component according to claim 1, further comprising a plurality of the external terminal electrodes, wherein first regions of the plurality of external terminal electrodes are arranged around a point on the mounting surface.

4. The multilayer electronic component according to claim 3, wherein the point on the mounting surface is a center point of the mounting surface.

5. The multilayer electronic component according to claim 1, further comprising a plurality of the external terminal electrodes, wherein second regions of the plurality of external terminal electrodes are arranged around a point on the mounting surface.

6. The multilayer electronic component according to claim 5, wherein the point on the mounting surface is a center point of the mounting surface.

7. The multilayer electronic component according to claim 1, wherein the first region is provided outside the second region with respect to a center of the mounting surface of the resin layer.

8. The multilayer electronic component according to claim 1, wherein the second region is provided outside the first region with respect to a center of the mounting surface of the resin layer.

9. The multilayer electronic component according to claim 1, wherein the external terminal electrode includes a land portion and a lead portion having a smaller width than the land portion, wherein the first region is disposed on the lead portion and the second region is disposed on the land portion.

10. The multilayer electronic component according to claim 9, wherein the lead portion is bent at a plurality of points.

11. The multilayer electronic component according to claim 1, further comprising a resist on the surface of the external terminal electrode facing away from the mounting surface, the resist arranged adjacent to the second region and within the region in which the first region is projected.

12. The multilayer electronic component according to claim 1, wherein the component body comprises a multilayer ceramic substrate including laminated ceramic layers.

13. The multilayer electronic component according to claim 1, further comprising a first circuit element disposed inside the component body, a second circuit element disposed inside the resin layer, and an intermediate conductor disposed on the first main surface to electrically connect the first circuit element and the second circuit element.

14. The multilayer electronic component according to claim 1, further comprising a first circuit element disposed inside the component body, and a first circuit component disposed on the second main surface and electrically connected to the first circuit element.

15. The multilayer electronic component according to claim 14, further comprising a mold resin layer disposed on the second main surface so as to cover the first circuit component.

16. The multilayer electronic component according to claim 14, further comprising a metal case connected to the component body so as to cover the first circuit component.

17. The multilayer electronic component according to claim 1, further comprising a first circuit element disposed inside the component body, and a circuit component disposed on the first main surface and electrically connected to the first circuit element.

18. The multilayer electronic component according to claim 17, further comprising at least a ground electrode or a dummy electrode provided on the first main surface.

19. The multilayer electronic component according to claim 18, wherein the ground electrode or the dummy electrode is a sintered metal.

20. A structure for mounting the multilayer electronic component according to claim 1, wherein the multilayer electronic component is connected to the motherboard so as to mount the multilayer electronic component with the bonding member disposed therebetween, the bonding member being provided in the second region of the external terminal electrode.

* * * * *

UNITED STATES PATENT AND TRADEMARK OFFICE
CERTIFICATE OF CORRECTION

PATENT NO. : 7,656,677 B2
APPLICATION NO. : 10/554671
DATED : February 2, 2010
INVENTOR(S) : Ogawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 125 days.

Signed and Sealed this

Thirtieth Day of November, 2010

David J. Kappos
*Director of the United States Patent and Trademark Office*